(12) United States Patent
Sugimoto et al.

(10) Patent No.: US 11,693,230 B2
(45) Date of Patent: Jul. 4, 2023

(54) OPTICAL DEVICE

(71) Applicant: HAMAMATSU PHOTONICS K.K., Hamamatsu (JP)

(72) Inventors: Tatsuya Sugimoto, Hamamatsu (JP); Tomofumi Suzuki, Hamamatsu (JP); Kyosuke Kotani, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 223 days.

(21) Appl. No.: 16/762,174

(22) PCT Filed: Sep. 4, 2018

(86) PCT No.: PCT/JP2018/032760
§ 371 (c)(1),
(2) Date: May 7, 2020

(87) PCT Pub. No.: WO2019/097818
PCT Pub. Date: May 23, 2019

(65) Prior Publication Data
US 2020/0363630 A1    Nov. 19, 2020

(30) Foreign Application Priority Data

Nov. 15, 2017    (JP) ................. 2017-220237

(51) Int. Cl.
*G02B 26/08*    (2006.01)
*G02B 7/182*    (2021.01)
(Continued)

(52) U.S. Cl.
CPC ...... *G02B 26/0841* (2013.01); *B81C 1/00555* (2013.01); *G02B 7/1821* (2013.01);
(Continued)

(58) Field of Classification Search
CPC .......... G02B 26/0841; G02B 7/1821; G02B 26/105; G02B 26/0833; G02B 26/08;
(Continued)

(56) References Cited

U.S. PATENT DOCUMENTS 6,507,138 B1    1/2003    Rodgers et al.
7,699,296 B1    4/2010    Knollenberg et al.
(Continued)

FOREIGN PATENT DOCUMENTS

CN    1619351 A    5/2005
CN    1650214 A    8/2005
(Continued)

OTHER PUBLICATIONS

Akin Aydemir et al., "A new design and a fabrication approach to realize a high performance three axes capacitive MEMS accelerometer", Sensors and Actuators A Physical, vol. 244, Jun. 15, 2016, p. 324-p. 333.

(Continued)

*Primary Examiner* — Balram T Parbadia
*Assistant Examiner* — Rahman Abdur
(74) *Attorney, Agent, or Firm* — Faegre Drinker Biddle & Reath LLP

(57) ABSTRACT

In an optical device, when viewed from a first direction, first, second, third, and fourth movable comb electrodes are respectively disposed between a first support portion and a first end of a movable unit, between a second support portion and a second end of the movable unit, between a third support portion and the first end, and between a fourth support portion and the second end of the movable unit. The first and second support portions respectively include first and second rib portions formed so that the thickness of each of the first and second support portions becomes greater than the thickness of the first torsion bar. The third and fourth (Continued)

support portions respectively include third and fourth rib portions formed so that the thickness of each of the third and fourth support portions becomes greater than the thickness of the second torsion bar.

10 Claims, 6 Drawing Sheets

(51) Int. Cl.
*H02N 1/00* (2006.01)
*G02B 26/10* (2006.01)
*B81C 1/00* (2006.01)

(52) U.S. Cl.
CPC ........... *G02B 26/105* (2013.01); *H02N 1/008* (2013.01); *B81B 2201/042* (2013.01); *B81C 2201/013* (2013.01); *B81C 2201/0174* (2013.01); *B81C 2201/0198* (2013.01)

(58) Field of Classification Search
CPC .............. H02N 1/008; B81B 2201/042; B81B 2203/0109; B81B 2203/0154; B81B 3/0045
USPC ....................................... 359/221.2
See application file for complete search history.

(56) References Cited

U.S. PATENT DOCUMENTS

| | | |
|---|---|---|
| 8,353,600 B1 | 1/2013 | Fu |
| 8,729,770 B1 | 5/2014 | Milanovic |
| 11,187,872 B2 | 11/2021 | Sugimoto et al. |
| 2002/0109894 A1 | 8/2002 | Clark et al. |
| 2004/0004775 A1 | 1/2004 | Turner et al. |
| 2004/0081391 A1* | 4/2004 | Ko .................... B81B 3/0062 385/18 |
| 2004/0232107 A1 | 11/2004 | Kouma et al. |
| 2005/0099665 A1 | 5/2005 | Lee et al. |
| 2005/0194650 A1 | 9/2005 | Hung |
| 2005/0194840 A1 | 9/2005 | Mori et al. |
| 2006/0082250 A1 | 4/2006 | Ko et al. |
| 2008/0123242 A1 | 5/2008 | Zhou |
| 2008/0198249 A1 | 8/2008 | Tanimura et al. |
| 2008/0247029 A1 | 10/2008 | Zhou |
| 2008/0284078 A1 | 11/2008 | Wolter et al. |
| 2009/0107949 A1 | 4/2009 | Kouma et al. |
| 2009/0109512 A1 | 4/2009 | Park |
| 2009/0225387 A1 | 9/2009 | Mizuno et al. |
| 2010/0208347 A1 | 8/2010 | Kouma et al. |
| 2011/0080627 A1 | 4/2011 | He et al. |
| 2011/0090551 A1 | 4/2011 | Pirk et al. |
| 2011/0109194 A1* | 5/2011 | Hung .................... H02N 1/008 310/300 |
| 2011/0205608 A1 | 8/2011 | Mizoguchi |
| 2012/0099176 A1 | 4/2012 | Zhou |
| 2012/0160557 A1 | 6/2012 | Yamada et al. |
| 2012/0162739 A1 | 6/2012 | Yamada |
| 2012/0236382 A1 | 9/2012 | Puegner et al. |
| 2013/0083379 A1 | 4/2013 | Tanaka et al. |
| 2013/0321892 A1 | 12/2013 | Haeberle et al. |
| 2014/0125950 A1 | 5/2014 | Shimada et al. |
| 2014/0137670 A1 | 5/2014 | Hata et al. |
| 2014/0300942 A1 | 10/2014 | Van Lierop et al. |
| 2014/0327946 A1 | 11/2014 | van Lierop et al. |
| 2014/0355091 A1 | 12/2014 | Mizutani |
| 2014/0362460 A1 | 12/2014 | Nozu et al. |
| 2015/0028698 A1 | 1/2015 | Gutierrez |
| 2015/0234176 A1 | 8/2015 | Zhou |
| 2016/0216508 A1 | 7/2016 | Tamamori |
| 2017/0139200 A1 | 5/2017 | Chang et al. |

FOREIGN PATENT DOCUMENTS

| | | |
|---|---|---|
| CN | 1790181 A | 6/2006 |
| CN | 1837892 A | 9/2006 |
| CN | 101246258 A | 8/2008 |
| CN | 101279708 A | 10/2008 |
| CN | 101284642 A | 10/2008 |
| CN | 101290395 A | 10/2008 |
| CN | 101316789 A | 12/2008 |
| CN | 101410744 A | 4/2009 |
| CN | 101786592 A | 7/2010 |
| CN | 101894711 A | 11/2010 |
| CN | 102177465 A | 9/2011 |
| CN | 102265033 A | 11/2011 |
| CN | 102369153 A | 3/2012 |
| CN | 102667497 A | 9/2012 |
| CN | 102868383 A | 1/2013 |
| CN | 103288034 A | 9/2013 |
| CN | 103803478 A | 5/2014 |
| CN | 203825034 U | 9/2014 |
| CN | 104216109 A | 12/2014 |
| CN | 104272167 A | 1/2015 |
| CN | 104348326 A | 2/2015 |
| CN | 104964678 A | 10/2015 |
| CN | 105453408 A | 3/2016 |
| CN | 105492879 A | 4/2016 |
| CN | 105594114 A | 5/2016 |
| CN | 105826252 A | 8/2016 |
| CN | 105899995 A | 8/2016 |
| CN | 106500682 A | 3/2017 |
| CN | 106597016 A | 4/2017 |
| CN | 106604887 A | 4/2017 |
| CN | 106707415 A | 5/2017 |
| EP | 1677086 A1 | 7/2006 |
| EP | 3015901 A1 | 5/2016 |
| EP | 3070508 A1 | 9/2016 |
| JP | H8-506857 A | 7/1996 |
| JP | 2000-214407 A | 8/2000 |
| JP | 2002-524271 A | 8/2002 |
| JP | 2002-326197 A | 11/2002 |
| JP | 2003-029178 A | 1/2003 |
| JP | 2004-177543 A | 6/2004 |
| JP | 2004-215534 A | 8/2004 |
| JP | 2004-325578 A | 11/2004 |
| JP | 2005-010453 A | 1/2005 |
| JP | 2005-275198 A | 10/2005 |
| JP | 2006-343481 A | 12/2006 |
| JP | 2007-155965 A | 6/2007 |
| JP | 2007-183400 A | 7/2007 |
| JP | 2007-188073 A | 7/2007 |
| JP | 2008-055516 A | 3/2008 |
| JP | 2008-083122 A | 4/2008 |
| JP | 2009-171394 A | 7/2009 |
| JP | 2010-008611 A | 1/2010 |
| JP | 2010-029976 A | 2/2010 |
| JP | 2010-054944 A | 3/2010 |
| JP | 2010-085506 A | 4/2010 |
| JP | 2010-128116 A | 6/2010 |
| JP | 2010-184334 A | 8/2010 |
| JP | 2011-069954 A | 4/2011 |
| JP | 2011-175044 A | 9/2011 |
| JP | 2012-042666 A | 3/2012 |
| JP | 2012-133242 A | 7/2012 |
| JP | 2012-184962 A | 9/2012 |
| JP | 2012-524295 A | 10/2012 |
| JP | 2012-528343 A | 11/2012 |
| JP | 2013-009447 A | 1/2013 |
| JP | 2013-016651 A | 1/2013 |
| JP | 2013-148707 A | 8/2013 |
| JP | 2014-006418 A | 1/2014 |
| JP | 2014-023207 A | 2/2014 |
| JP | 2014-035429 A | 2/2014 |
| JP | 2014-115267 A | 6/2014 |
| JP | 2014-215534 A | 11/2014 |
| JP | 2014-235260 A | 12/2014 |
| JP | 2014-238581 A | 12/2014 |
| JP | 2015-093340 A | 5/2015 |
| JP | 2015-102483 A | 6/2015 |
| JP | 2015-219516 A | 12/2015 |

(56) References Cited

FOREIGN PATENT DOCUMENTS

| | | |
|---|---|---|
| JP | 2016-085299 A | 5/2016 |
| JP | 2016-114798 A | 6/2016 |
| JP | 2016-151681 A | 8/2016 |
| JP | 2016-200834 A | 12/2016 |
| JP | 2016-212221 A | 12/2016 |
| JP | 2017-058418 A | 3/2017 |
| JP | 2017-070163 A | 4/2017 |
| JP | 2017-129783 A | 7/2017 |
| TW | 201531709 A | 8/2015 |
| TW | I563290 B | 12/2016 |
| TW | 201717371 A | 5/2017 |
| TW | 201718896 A | 6/2017 |
| TW | I588533 B | 6/2017 |
| WO | WO 94/018697 A1 | 8/1994 |
| WO | WO-00/013210 A2 | 3/2000 |
| WO | WO 2009/124607 A1 | 10/2009 |
| WO | WO-2010/121185 A1 | 10/2010 |
| WO | WO-2010/136358 A2 | 12/2010 |
| WO | WO 2011/091012 A2 | 7/2011 |
| WO | WO-2013/046612 A1 | 4/2013 |
| WO | WO 2015/068400 A1 | 5/2015 |
| WO | WO-2016/002453 A1 | 1/2016 |

OTHER PUBLICATIONS

Sandner, Thilo, et al., "Out-of-plane translatory MEMS actuator with extraordinary large stroke for optical path length modulation in miniaturized FTIR Spectrometers," Sensor+Test Conferences 2011, Proceedings IRS2, Jun. 9, 2011, p. 151-p. 156.

International Preliminary Report on Patentability dated Jan. 16, 2020 for PCT/JP2018/025640.
International Preliminary Report on Patentability dated May 28, 2020 for PCT/JP2018/029117.
International Preliminary Report on Patentability dated May 28, 2020 for PCT/JP2018/032760.
International Preliminary Report on Patentability dated Jan. 16, 2020 for PCT/JP2018/025634.
International Preliminary Report on Patentability dated Jan. 16, 2020 for PCT/JP2018/025635.
International Preliminary Report on Patentability dated Jan. 16, 2020 for PCT/JP2018/025636.
International Preliminary Report on Patentability dated Jan. 16, 2020 for PCT/JP2018/025637.
International Preliminary Report on Patentability dated Jan. 16, 2020 for PCT/JP2018/025638.
International Preliminary Report on Patentability dated Jan. 16, 2020 for PCT/JP2018/025639.
Sun Fengming et al., "MEMS Based Micro Displacement Sensor and Its Application", Chinese Journal of Sensors and Actuators, vol. 26, No. 2, Feb. 2013, p. 293-p. 296.
Sandner Thilo et al., "Translatory MEMS actuator and their system integration for miniaturized Fourier transform spectrometers", MOEMS and Miniaturized Systems XI, SPIE, 1000 20th St. Bellingham WA 98225-6705 USA, vol. 8252, No. 1, May 8, 2012, p. 1-p. 10, XP060023646.
Anonymous, "Michelson Interferometer—Definition and Applications", URL:https://www.azooptics.com/Article.aspx?ArticleID=698, May 6, 2014, XP093017159.

\* cited by examiner

OPTICAL DEVICE

TECHNICAL FIELD

The present disclosure relates to an optical device that is constituted, for example, as a micro electro mechanical systems (MEMS) device.

BACKGROUND ART

There is known an optical device including a base, a movable unit including an optical function unit, a pair of torsion bars which respectively connected to the base and the movable unit on both sides of the movable unit, a movable comb electrode including a plurality of movable comb fingers, and a fixed comb electrode including a plurality of fixed comb fingers which are disposed alternately with the plurality of movable comb fingers. In a device described in Patent Literature 1, the movable comb electrode is provided in a support portion that extends from the movable unit along the torsion bars.

CITATION LIST

Patent Literature

Patent Literature 1: US Unexamined Patent Publication No. 2005/0194650

SUMMARY OF INVENTION

Technical Problem

The above-described movable comb electrode and fixed comb electrode can be used as an electrode for driving, an electrode for monitoring, or an electrode for driving and monitoring. In a case where the movable comb electrode and the fixed comb electrode are used as the electrode for driving, a voltage is applied to between the movable comb electrode and the fixed comb electrode to swing the movable unit with a predetermined axial line set as a central line. In a case where the movable comb electrode and the fixed comb electrode are used as the electrode for monitoring, electrostatic capacitance between the movable comb electrode and die fixed comb electrode is detected to understand a position (a swing angle) of the movable unit that swings with the predetermined axial line set as a central line.

Even in a case where the movable comb electrode and the fixed comb electrode are used for any use, it is preferable that the movable comb electrode swings integrally with the movable unit when the movable unit swings, and an interval between a movable comb finger and a fixed comb finger which are adjacent to each other is constantly maintained. However, in the device described in Patent Literature 1, since the support portion in which the movable comb electrode is provided extends from the movable unit along the torsion bars, when the movable unit swings, the movable comb electrode is distorted, and thus there is a concern that reliability as a device may deteriorate.

An object of the present disclosure is to provide an optical device with high reliability.

Solution to Problem

According to an aspect of the present disclosure, there is provided an optical device including: a base; a movable unit that includes an optical function unit; a first torsion bar that is disposed on one side of the movable unit in a first direction, and is connected to the base and the movable unit; a second torsion bar that is disposed on the other side of the movable unit in the first direction, and is connected to the base and the movable unit; a first support portion that is disposed on one side of the first torsion bar in a second direction perpendicular to the first direction, and is connected to the movable unit; a second support portion that is disposed on the other side of the first torsion bar in the second direction, and is connected to the movable unit; a third support portion that is disposed on the one side of the second torsion bar in the second direction, and is connected to the movable unit; a fourth support portion that is disposed on the other side of the second torsion bar in the second direction, and is connected to the movable unit; a first movable comb electrode that is provided to the first support portion, and includes a plurality of first movable comb fingers; a second movable comb electrode that is provided to the second support portion, and includes a plurality of second movable comb fingers; a third movable comb electrode that is provided to the third support portion, and includes a plurality of third movable comb fingers; a fourth movable comb electrode that is provided to the fourth support portion, and includes a plurality of fourth movable comb lingers; a first fixed comb electrode that is provided to the base, and includes a plurality of first fixed comb fingers which are disposed alternately with the plurality of first movable comb fingers; a second fixed comb electrode that is provided to the base, and includes a plurality of second fixed comb fingers which are disposed alternately with the plurality of second movable comb fingers; a third fixed comb electrode that is provided to the base, and includes a plurality of third fixed comb fingers which are disposed alternately with the plurality of third movable comb fingers; and a fourth fixed comb electrode that is provided to the base, and includes a plurality of fourth fixed comb fingers which are disposed alternately with the plurality of fourth movable comb fingers. Each of the first movable comb fingers and each of the first fixed comb fingers which are adjacent to each other face each other in the first direction. Each of the second movable comb fingers and each of the second fixed comb fingers which are adjacent to each other face each other in the first direction. Each of the third movable comb fingers and each of the third fixed comb fingers which are adjacent to each other face each other in the first direction. Each of the fourth movable comb fingers and each of the fourth fixed comb fingers which are adjacent to each other face each other in the first direction. The first movable comb electrode is disposed between the first support portion and a first end of the movable unit on the one side in the second direction when viewed from the first direction. The second movable comb electrode is disposed between the second support portion and a second end of the movable unit on the other side in the second direction when viewed from the first direction. The third movable comb electrode is disposed between the third support portion and the first end of the movable unit when viewed from the first direction. The fourth movable comb electrode is disposed between the fourth support portion and the second end of the movable unit when viewed from the first direction. The first support portion includes a first rib portion that is formed so that the thickness of the first support portion in a third direction perpendicular to the first direction and the second direction becomes greater than the thickness of the first torsion bar in the third direction. The second support portion includes a second rib portion that is formed so that the thickness of the second support portion in the third direction becomes greater than the thickness of the first torsion bar in the third direction. The third support portion includes a third rib portion that is formed so that the thickness of the third support portion in the third direction becomes greater than the thickness of the second torsion bar in the third direction. The fourth support portion includes a fourth rib portion that is formed so that the thickness of the fourth support portion in the third direction becomes greater than the thickness of the second torsion bar in the third direction.

In the optical device, the first or third movable comb electrode is located more to the first or second torsion bar side than the first end of the movable unit on the one side in the second direction when viewed from the first direction, and the second or fourth movable comb electrode is located more to the first or second torsion bar side than the second end of the movable unit on the other side in the second direction when viewed from the first direction. According to this, even in a case where the movable unit greatly swings with an axial line parallel to the first direction set as a central line, it is possible to suppress deviation of the entirety of the movable comb fingers from regions between adjacent fixed comb fingers. In addition, in the optical device, since the first and second rib portions are formed, the thickness of each of the first and second support portions in the third direction becomes greater than the thickness of the first torsion bar in the third direction, and since the third and fourth rib portions are formed, the thickness of each of the third and fourth support portions in the third direction becomes greater than the thickness of the second torsion bar in the third direction. According to this, when the movable unit swings, it is possible to suppress distortion of the first, second, third, and fourth support portions. Accordingly, it is possible to cause the first, second, third, and fourth movable comb electrodes to swing integrally with the movable unit, and thus it is possible to suppress a fluctuation of an interval between the movable comb finger and the fixed comb finger which are adjacent to each other. As described above, an optical device with high reliability is obtained.

In the optical device according to the aspect of the present disclosure, the first support portion may further include a first main body portion to which the first movable comb electrode is provided, the second support portion may further include a second main body portion to which the second movable comb electrode is provided, the third support portion may further include a third main body portion to which the third movable comb electrode is provided, the fourth support portion may further include a fourth main body portion to which the fourth movable comb electrode is provided, and the first torsion bar, the first main body portion, the second main body portion, the second torsion bar, the third main body portion, and the fourth main body portion may extend along the first direction. According to this, it is possible to dispose respective portions with efficiency while realizing simplification of a structure.

In the optical device according to the aspect of the present disclosure, the first support portion may further include a first connection portion that is connected to the first main body portion and the movable unit, and the first connection portion may have a shape that is bent to he spaced apart from the first torsion bar. The second support portion may further include a second connection portion that is connected to the second main body portion and the movable unit, and the second connection portion may have a shape that is bent to be spaced apart from the first torsion bar. The third support portion may further include a third connection portion that is connected to the third main body portion and the movable unit, and the third connection portion may have a shape that is bent to be spaced apart from the second torsion bar. The fourth support portion may further include a fourth connection portion that is connected to the fourth main body portion and the movable unit, and the fourth connection portion may have a shape that is bent to be spaced apart from the second torsion bar. According to this, it is possible to improve the degree of design of a portion where each of the first and second torsion bars is connected to the movable unit. In addition, the first and second main body portions can be disposed to be close to the first torsion bar, and the third and fourth main body portions can be disposed to he close to the second torsion bar. Accordingly, even in a case where the movable unit greatly swings with an axial line parallel to the first direction set as a central line, it is possible to suppress deviation of the entirety of the movable comb fingers from regions between adjacent fixed comb fingers.

In the optical device according to the aspect of the present disclosure, the first torsion bar may be connected to the movable unit in such a manner that curvatures of an outer edge of the first torsion bar and an outer edge of the movable unit are continuous when viewed from the third direction, and the second torsion bar may be connected to the movable unit in such a manner that curvatures of an outer edge of the second torsion bar and an outer edge of the movable unit are continuous when viewed from the third direction. According to this, stress concentration is less likely to occur in a portion where each of the first and second torsion bars is connected to the movable unit, and thus it is possible to suppress breakage of the first and second torsion bars.

The optical device according to the aspect of the present disclosure may further include a fifth movable comb electrode that is provided to a portion including the first end in the movable unit, and includes a plurality of fifth movable comb fingers, a sixth movable comb electrode that is provided to a portion including the second end in the movable unit, and includes a plurality of sixth movable comb fingers, a fifth fixed comb electrode that is provided to the base, and includes a plurality of fifth fixed comb fingers which are disposed alternately with the plurality of fifth movable comb fingers, and a sixth fixed comb electrode that is provided to the base, and includes a plurality of sixth fixed comb fingers which are disposed alternately with the plurality of sixth movable comb fingers. Each of the fifth movable comb fingers and each of the fifth fixed comb fingers which are adjacent to each other may face each other in the first direction, and each of the sixth movable comb fingers and each of the sixth fixed comb fingers which are adjacent to each other may face each other in the first direction. In this case, when a voltage is applied to between the fifth movable comb electrode and the fifth fixed comb electrode, and between the sixth movable comb electrode and the sixth fixed comb electrode, the electrodes can be used as electrode for driving. At this time, with regard to a distance from the first and second torsion bars, a distance on the fifth movable comb electrode side is greater than a distance on the first movable comb electrode side and on the third movable comb electrode side, and a distance on the sixth movable comb electrode side is greater than a distance on the second movable comb electrode side and on the fourth movable comb electrode side. According to this, it is possible to obtain torque necessary for causing the movable unit to swing even When the magnitude of an electrostatic force that is generated in the electrodes for driving (that is, the magnitude of a voltage that is applied to the electrodes for driving) is not enlarged. In addition, when detecting electrostatic capacitance between the first movable comb electrode and the first fixed comb electrode, between the second movable comb electrode and the second fixed comb electrode, between the third movable comb electrode and the third fixed comb electrode, and between the fourth movable comb electrode and the fourth fixed comb electrode, it is possible to use the electrodes as electrodes for monitoring. At this time, even when the movable unit is caused to greatly swing, deviation of the entirety of the movable comb fingers from regions between adjacent fixed comb fingers is suppressed. According to this, it is possible to understand a position (a swing angle) of the movable unit in the entirety of ranges in which the movable unit swings.

In the optical device according to the aspect of the present disclosure, the movable comb electrodes may not be provided to the movable unit. In this case, when applying a voltage to between the first movable comb electrode and the first fixed comb electrode, between the second movable comb electrode and the second fixed comb electrode, between the third movable comb electrode and the third fixed comb electrode, and between the fourth movable comb electrode and the fourth fixed comb electrode, it is possible to use the electrodes as electrodes for driving. At this time, even when the movable unit is caused to greatly swing, deviation of the entirety of the movable comb fingers from regions between adjacent fixed comb fingers is suppressed. According to this, it is possible to improve controllability in drive signal setting such as magnitude and a cycle of an application voltage. In addition, when detecting electrostatic capacitance between the first movable comb electrode and the first fixed comb electrode, between the second movable comb electrode and the second fixed comb electrode, between the third movable comb electrode and the third fixed comb electrode, and between the fourth movable comb electrode and the fourth fixed comb electrode, it is also possible to use the electrodes as electrode for monitoring. At this time, even when the movable unit is caused to greatly swing, deviation of the entirety of the movable comb fingers from regions between adjacent fixed comb fingers is suppressed. Accordingly, it is possible to understand a position (a swing angle) of the movable unit in the entirety of ranges in which the movable unit swings.

In the optical device according to the aspect of the present disclosure, the movable unit may further include a fifth main body portion to which the optical function unit is provided, to frame that surrounds the fifth main body portion when viewed from the third direction, a plurality of fifth connection portions that are connected to the fifth main body portion and the frame, a main body rib portion that is provided to the fifth main body portion, and a frame rib portion that extends along the frame, and the first rib portion, the second rib portion, the third rib portion, and the fourth rib portion may be connected to the frame rib portion. According to this, an influence of twisting of the first and second torsion bars is less likely to be transferred to the optical function unit, and thus it is possible to suppress distortion of the optical function unit. In addition, the movable unit, and the first, second, third, and fourth support portions are less likely to be distorted integrally with each other, and thus it is possible to more reliably suppress a fluctuation of an interval between a movable comb finger and a fixed comb finger adjacent to each other. In the optical device according to the aspect of the present disclosure, the movable unit ma further include a connection rib portion that is connected to the main body rib portion and the frame rib portion in each of plurality of fifth connection portions. According to this, it is possible to more reliably suppress distortion of the optical function unit, and the first, second, third, and fourth support portions.

In the optical device according to the aspect of the present disclosure, the plurality of fifth connection portions may be disposed at positions corresponding to the first end and the second end of the movable unit. According to this, an influence of the twisting of the first and second torsion bars is more less likely to be transferred to the optical function unit, and thus it is possible to more reliably suppress distortion of the optical function unit.

In the optical device according to the aspect of the present disclosure, the optical function unit may be a mirror. According to this, for example, it is possible to appropriately scan a predetermined region with laser light.

Advantageous Effects of Invention

According to the present disclosure, it is possible to provide an optical device with high reliability.

DESCRIPTION OF EMBODIMENTS

Figure 1:
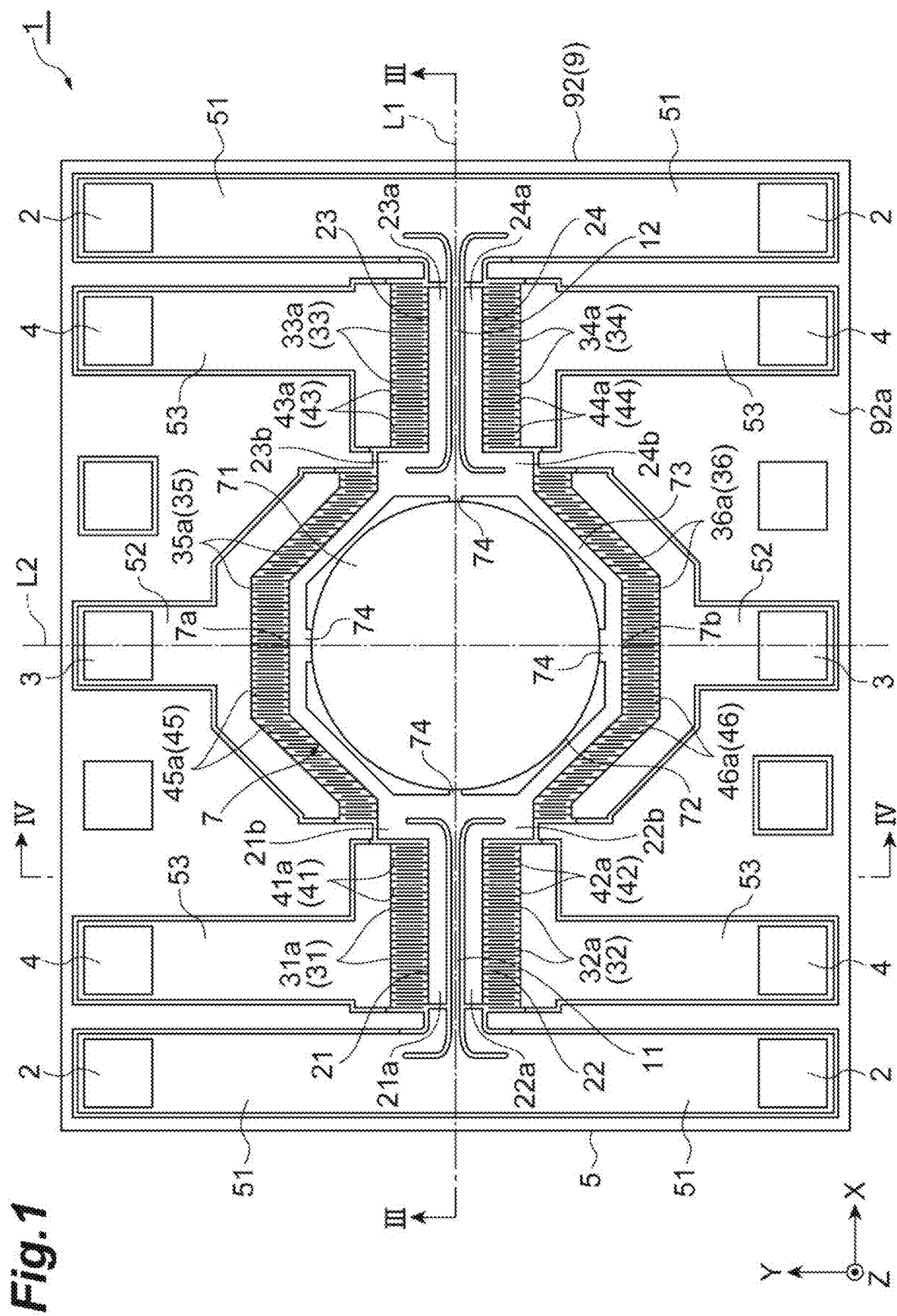
FIG. 1 is a plan view of an optical device of a first embodiment.
Figure 2:
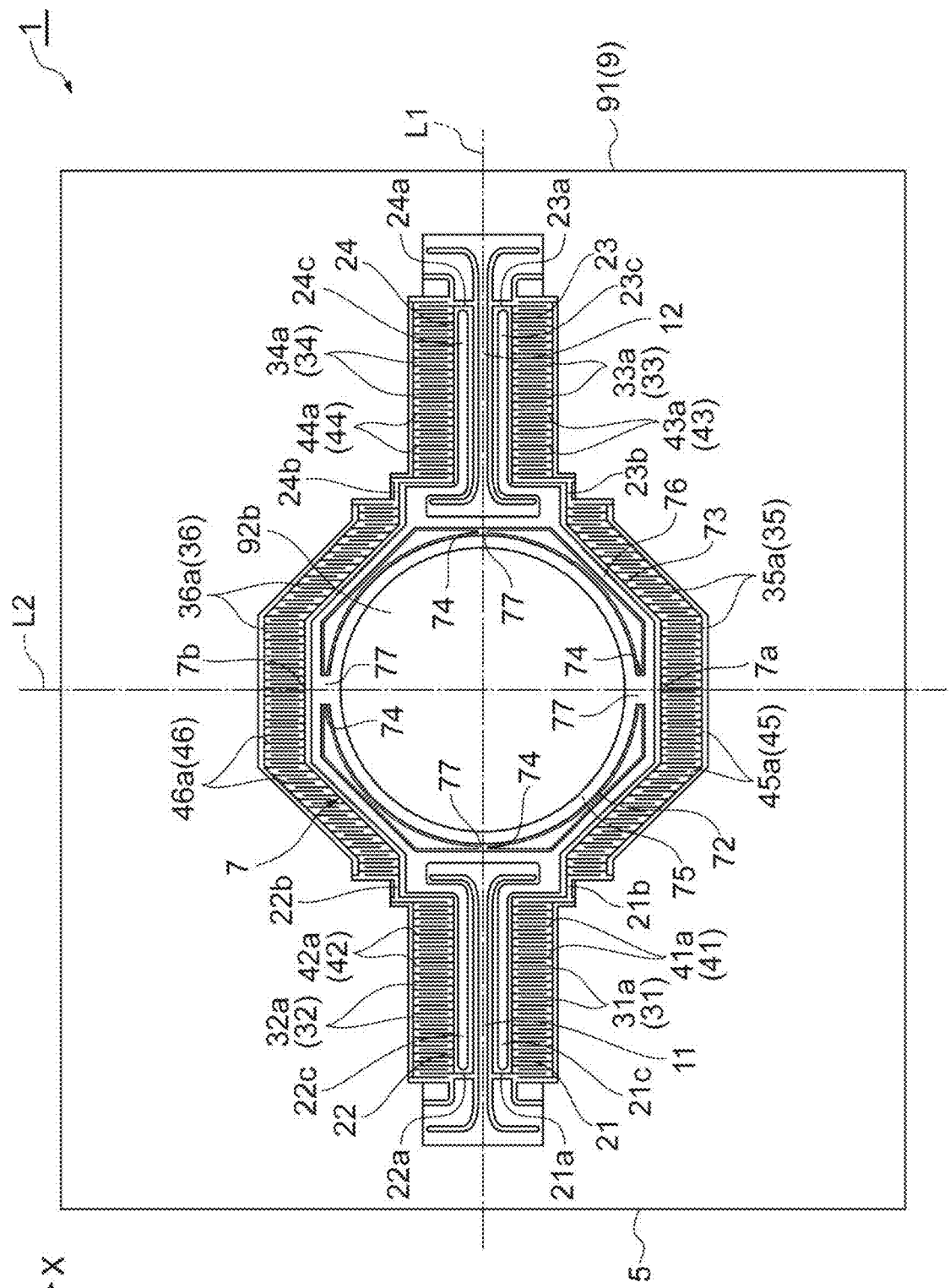
FIG. 2 is a bottom view of the optical device illustrated in FIG. 1.
Figure 3:
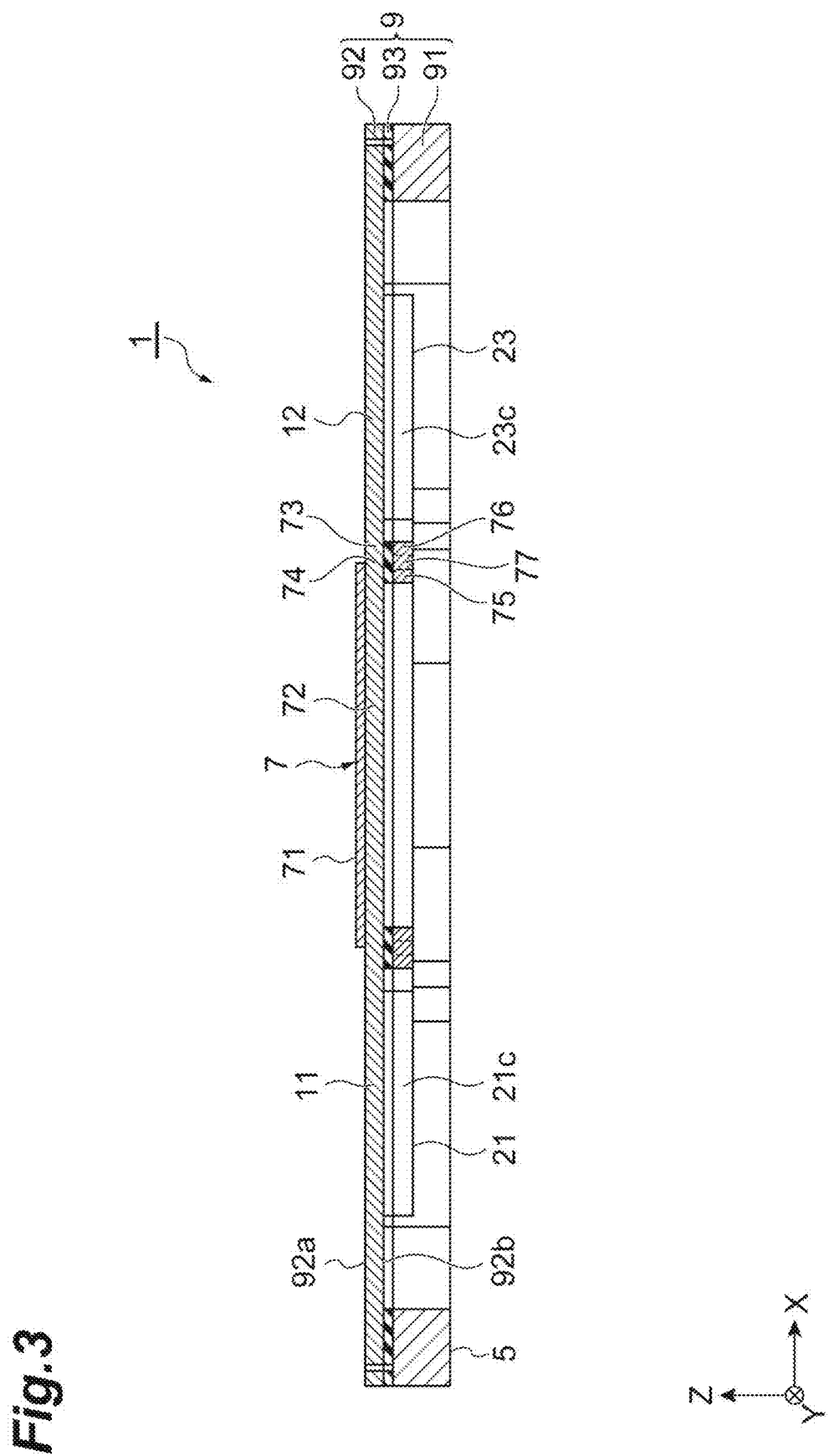
FIG. 3 is a cross-sectional view of the optical device along line III-III illustrated in FIG. 1.
Figure 4:
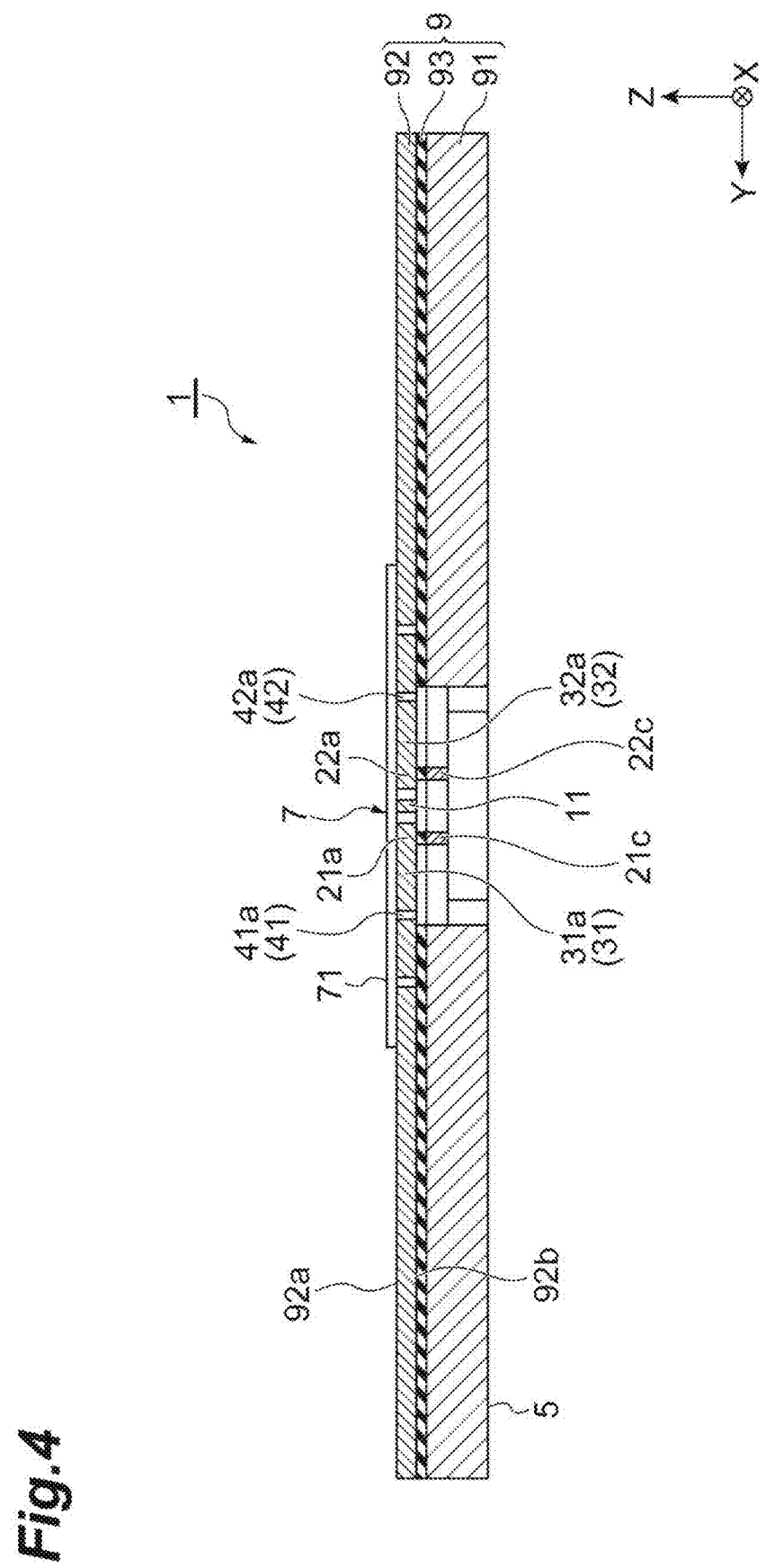
FIG. 4 is a cross-sectional view of the optical device along line IV-IV illustrated in FIG. 1.

Hereinafter, an embodiment of the present disclosure will be described with reference to the accompanying drawings. Note that, in the drawings, the same reference numeral will be given to the same or equivalent element, and redundant description will be omitted.

As illustrated in FIG. 1, FIG. 2, FIG. 3, and FIG. 4, an optical device 1 includes a base 5, a movable unit 7, a first torsion bar 11, and a second torsion bar 12. The optical device 1 is constituted by a silicon on insulator (SOI) substrate 9 as an MEMS device For example, the optical device 1 has a rectangular plate shape. For example, the optical device 1 has a size of approximately 9 mm×7 mm×0.4 mm (thickness).

The base 5 is formed by parts of a handle layer 91, a device layer 92, and an intermediate layer 93 which constitute the SOI substrate 9. The handle layer 91 is a first silicon layer. The device layer 92 is a second silicon layer. The intermediate layer 93 is an insulating layer disposed between the handle layer 91 and the device layer 92.

The movable unit 7 is disposed in a state in which an intersection between an axial line L1 and an axial line L2 is set as a central position (center-of-gravity position). The axial line L1 is a straight line that extends in an X-axis direction (a direction parallel to an X-axis, a first direction). The axial line L2 is a straight line that extends in a Y-axis direction (a direction parallel to a Y-axis, a second direction perpendicular to the first direction). When viewed from a Z-axis direction (a direction parallel to a Z-axis, a third direction perpendicular to the first direction and the second direction), the movable unit 7 has a shape that is line-symmetric to the axial line L1 and is line-symmetric to the axial line L2.

The movable unit 7 includes an optical function unit 71, a fifth main body portion 72, a frame 73, a plurality of fifth connection portions 74, a main body rib portion 75, a frame rib portion 76, and a plurality of connection rib portions 77. The optical function unit 71 is provided in the fifth main body portion 72. The optical function unit 71 is a mirror that is formed on a surface 92a, which is opposite to the handle layer 91, in the device layer 92 that constitutes the fifth main body portion 72. For example, the mirror is obtained by forming a metallic film on the surface 92a of the device layer 92 that constitutes the fifth main body portion 72 through vapor deposition.

The fifth main body portion 72 is formed by a part of the device layer 92. For example, the fifth main body portion 72 has a circular shape when viewed from the Z-axis direction. The frame 73 surrounds the fifth main body portion 72 when viewed from the z-axis direction. The frame 73 is formed by a part of the device layer 92. For example, the frame 73 has an octagonal ring shape when viewed from the Z-axis direction. The plurality of fifth connection portions 74 are respectively disposed on both sides of the fifth main body portion 72 on the axial line L1, and both sides of the fifth main body portion 72 on the axial line L2. Specifically, the plurality of fifth connection portions 74 are disposed at a position corresponding to a first end 7a (position between the first end 7a and a central position of the movable unit 7), a position corresponding to a second end 7b (position between the second end 7b and a central, position of the movable unit 7), a position on an extending line of the first torsion bar 11, and a position on an extending line of the second torsion bar 12. Each of the fifth connection portions 74 is connected to the fifth main body portion 72 and the frame 73. Each of the fifth connection portions 74 is bridged between the fifth main body portion 72 and the frame 73. The fifth connection portion 74 is formed by a part of the device layer 92.

The main body rib portion 75 extends along an outer edge of the fifth main body portion 72. The main body rib portion 75 is formed by parts of the handle layer 91 and the intermediate layer 93. The main body rib portion 75 is formed on a surface 92b on the handle layer 91 side in the device layer 92 that constitutes the main body portion 72. For example, the main body rib portion 75 has a circular ring shape when viewed from the Z-axis direction. The frame rib portion 76 extends along the frame 73. The frame rib portion 76 is formed by parts of the handle layer 91 and the intermediate layer 93. The frame rib portion 76 is formed on the surface 92b of the device layer 92 that constitutes the frame 73. For example, the frame rib portion 76 has an octagonal ring shape when viewed from the Z-axis direction. The plurality of connection rib portions 77 are respectively disposed in the plurality of fifth connection portions 74. Each of the connection rib portions 77 is connected to the main body rib portion 75 and the frame rib portion 76. Each of the connection rib portions 77 is bridged between the main body rib portion 75 and the frame rib portion 76. Each of the connection rib portions 77 is formed by parts of the handle layer 91 and the intermediate layer 93. Each of the connection rib portions 77 is formed on the surface 92b of the device layer 92 that constitutes the fifth connection portion 74.

The first torsion bar 11 is disposed on one side of the movable unit 7 in the X-axis direction. The first torsion bar 11 extends along the X-axis direction on the axial line L1. The first torsion bar 11 is formed by a part of the device layer 92. The first torsion bar 11 is connected to the base 5 and the movable unit 7. The first torsion bar 11 is bridged between the base 5 and the movable unit 7 (the frame 73 in the optical device 1). The first torsion bar 11 is connected to the movable unit 7 in such a manner that curvatures of an outer edge of the first torsion bar 11 and an outer edge of the movable unit 7 (an outer edge of the frame 73 in the optical device 1) are continuous when viewed from the Z-axis direction. Specifically, in the first torsion bar 11, a portion that is connected to the movable unit 7 has a shape in which both side surfaces of the portion are curved in a concave shape so that a width of the portion in the Y-axis direction increases as it approaches the movable unit 7. Similarly, in the first torsion bar 11, a portion that is connected to the base 5 has a shape in which both sides surfaces of the portion are curved in a concave shape so that a width of the portion in the Y-axis direction increases as it approaches the base 5.

The second torsion bar 12 is disposed on the other side of the movable unit 7 in the X-axis direction. The second torsion bar 12 extends on the axial line L1 along the X-axis direction. The second torsion bar 12 is formed by a part of the device layer 92. The second torsion bar 12 is connected to the base 5 and the movable unit 7. The second torsion bar 12 is bridged between the base 5 and the movable unit 7 (the frame 73 in the optical device 1). The second torsion bar 12 is connected to the movable unit 7 in such a manner that curvatures of an outer edge of the second torsion bar 12 and an outer edge of the movable unit 7 (the outer edge of the frame 73 in the optical device 1) are continuous when viewed from the Z-axis direction. Specifically, in the second torsion bar 12, a portion that is connected to the movable unit 7 has a shape in which both side surfaces of the portion are curved in a concave shape so that a width of the portion in the Y-axis direction increases as it approaches the movable unit 7. Similarly, in the second torsion bar 12, a portion that is connected to the base 5 has a shape in which both sides surfaces of the portion are curved in a concave shape so that a width of the portion in the Y-axis direction increases as it approaches the base 5.

The optical device 1 further includes a first support portion 21, a second support portion 22, a third support portion 23, and a fourth support portion 24. The first support portion 21 is disposed on one side of the first torsion bar in the Y-axis direction, and is connected to the movable unit 7. The second support portion 22 is disposed on the other side of the first torsion bar 11 in the Y-axis direction, and is connected to the movable unit 7. The third support portion 23 is disposed on one side of the second torsion bar 12 in the Y-axis direction, and is connected to the movable unit 7. The fourth support portion 24 is disposed on the other side of the second torsion bar 12 in the Y-axis direction, and the fourth support portion 24 is connected to the movable unit 7.

The first support portion 21 includes a first main body portion 21a, a first connection portion 21b, and a first rib portion 21c. The first main body portion 21a extends along the X-axis direction in a state in which a gap is formed between the first main body portion 21a and the first torsion bar 11. The first main body portion 21a is formed by a part of the device layer 92. The rate first connection portion 21b is connected to the first main body portion 21a and the movable unit 7. The first connection portion 21b is bridged between the first main body portion 21a and the movable unit 7 (the frame 73 in die optical device 1). The first connection portion 21b is formed by a part of the device layer 92. The first connection portion 21b has a shape that is bent to be spaced apart from the portion of the first torsion bar 11 which is connected to the movable unit 7. The first rib portion 21c is formed in the first main body portion 21a and the first connection portion 21b so that the thickness of the first support portion 21 in the Z-axis direction becomes larger than the thickness of the first torsion bar 11 in the Z-axis direction. The first rib portion 21c extends over the first main body portion 21a and the first connection portion 21b, and is connected to the frame rib portion 76. The first rib portion 21c is formed by a part of the handle layer 91 and the intermediate layer 93. A width of the first rib portion 21c in the Y-axis direction is smaller than a width of the first main body portion 21a in the Y-axis direction. The first rib portion 21c is formed on the surface 92b of the device layer 92 that constitutes the first main body portion 21a and the first connection portion 21b. In the optical device 1, the first rib portion 21c is a portion that protrudes from the surface 92b of the device layer 92 that constitutes the first and second torsion bars 11 and 12 in the Z-axis direction.

The second support portion 22 includes a second main body portion 22a, a second connection portion 22b, and a second rib portion 22c. The second main body portion 22a extends along the X-axis direction in a state in which a gap is formed between the second main body portion 22a and the first torsion bar 11. The second main body portion 22a is formed by a part of the device layer 92. The second connection portion 22b is connected to the second main body portion 22a and the movable unit 7. The second connection portion 22b is bridged between the second main body portion 22a and the movable unit 7 (the frame 73 in the optical device 1). The second connection portion 22b is formed by a part of the device layer 92. The second connection portion 22b has a shape that is bent to be spaced apart from the portion of the first torsion bar 11 which is connected to the movable unit 7. The second rib portion 22c is formed in the second main body portion 22a and the second connection portion 22b so that the thickness of the second support portion 22 in the Z-axis direction becomes larger than the thickness of the first torsion bar 11 in the Z-axis direction. The second rib portion 22c extends over the second main body portion 22a and the second connection portion 22b, and is connected to the frame rib portion 76. The second rib portion 22c is formed by a part of the handle layer 91 and the intermediate layer 93. A width of the second rib portion 22c in the Y-axis direction is smaller than a width of the second main body portion 22a in the Y-axis direction. The second rib portion 22c is formed on the surface 92b of the device layer 92 that constitutes the second main body portion 22a and the second connection portion 22b. In the optical device 1, the second rib portion 22c is a portion that protrudes from the surface 92b of the device layer 92 that constitutes the first and second torsion bars 11 and 12 in the Z-axis direction.

The third support portion 23 includes a third main body portion 23a, a third connection portion 23b, and a third rib portion 23c. The third main body portion 23a extends along the X-axis direction in a state in which a gap is formed between the third main body portion 23a and the second torsion bar 12. The third main body portion 23a is formed by a part of the device layer 92. The third connection portion 23b is connected to the third main body portion 23a and the movable unit 7. The third connection portion 23b is bridged between the third main body portion 23a and the movable unit 7 (the frame 73 in the optical device 1). The third connection portion 23b is formed by a part of the device layer 92. The third connection portion 23b has a shape that is bent to be spaced apart from the portion of the second torsion bar 12 which is connected to the movable unit 7. The third rib portion 23c is formed in the third main body portion 23a and the third connection portion 23b so that the thickness of the third support portion 23 in the Z-axis direction becomes larger than the thickness of the second torsion bar 12 in the Z-axis direction. The third rib portion 23c extends over the third main body portion 23a and the third connection portion 23b, and is connected to the frame rib portion 76. The third rib portion 23c is formed by a part of the handle layer 91 and the intermediate layer 93. A width of the third rib portion 23c in the Y-axis direction is smaller than a width of the third main body portion 23a in the Y-axis direction. The third rib portion 23c is formed on the surface 92b of the device layer 92 that constitutes the third main body portion 23a and the third connection portion 23b. In the optical device 1, the third rib portion 23c is a portion that protrudes from the surface 92b of the device layer 92 that constitutes the first and second torsion bars 11 and 12 in the Z-axis direction.

The fourth support portion 24 it a fourth main body portion 24a, a fourth connection portion 24b, and a fourth rib portion 24c. The fourth main body portion 24a extends along the X-axis direction in a state in which a gap is formed between the fourth main body portion 24a and the second torsion bar 12. The fourth main body portion 24a is formed by a part of the device layer 92. The fourth connection portion 24b is connected to the fourth main body portion 24a and the movable unit 7. The fourth connection portion 24b is bridged between the fourth main body portion 24a and the movable unit 7 (the frame 73 in the optical device 1). The fourth connection portion 24b is formed by a part of the device layer 92. The fourth connection portion 24b has a shape that is bent to be spaced apart from the portion of the second torsion bar 12 which is connected to the movable unit 7. The fourth rib portion 24c is formed in the fourth main body portion 24a and the fourth connection portion 24b so that the thickness of the fourth support portion 24 in the Z-axis direction becomes larger than the thickness of the second torsion bar 12 in the Z-axis direction. The fourth rib portion 24c extends over the fourth main body portion 24a and the fourth connection portion 24b, and is connected to the frame rib portion 76. The fourth rib portion 24c is formed by a part of the handle layer 91 and the intermediate layer 93. A width of the fourth rib portion 24c in the Y-axis direction is smaller than a width of the fourth main body portion 24a in the Y-axis direction. The fourth rib portion 24c is formed on the surface 92b of the device layer 92 that constitutes the fourth main body portion 24a and the fourth connection portion 24b. In the optical device 1, the fourth rib portion 24c is a portion that protrudes from the surface 92b of the device layer 92 that constitutes the first and second torsion bars 11 and 12 in the Z-axis direction.

The optical device 1 further includes a first movable comb electrode 31, a second movable comb electrode 32, a third movable comb electrode 33, a fourth movable comb electrode 34, a fifth movable comb electrode 35, and a sixth movable comb electrode 36 the first movable comb electrode 31 is provided in the first main body portion 21a of the first support portion 21. The second movable comb electrode 32 is provided in the second main body portion 22a of the second support portion 22. The third movable comb electrode 33 is provided in the third main body portion 23a of the third support portion 23. The fourth movable comb electrode 34 is provided in the fourth main body portion 24a of the fourth support portion 24. The fifth movable comb electrode 35 is provided a portion including the first, end 7a in movable unit 7. The first end 7a is an end on one side of the movable unit 7 in the Y-axis direction. In the optical device 1, the fifth inn able comb electrode 35 is provided in a portion that is located between the first connection portion 21b of the first support portion 21 and the third connection portion 23b of the third support portion 23 in the frame 73, and includes the first end 7a. The sixth movable comb electrode 36 is provided in a portion including the second end 7b in the movable unit 7. The second end 7b is an end on the other side of the movable unit 7 in the Y-axis direction, in the optical device 1, the sixth movable comb electrode 36 is provided in a portion that is located between the second connection portion 21b of the second support portion 22 and the fourth connection portion 24b of the fourth support portion 24, and includes the second end 7b.

The first movable comb electrode 31 is formed by a part of the device layer 92. The first movable comb electrode 31 is disposed between the first main body portion 21a of the first support portion 21 and the first end 7a of to movable unit 7 when viewed from the X-axis direction. The first comb electrode 31 includes a plurality of first movable comb fingers 31a. Each of the first movable comb fingers 31a is provided on a side surface, which is opposite to the first torsion bar 11, in the first main body portion 21a of the first support portion 21. Each of the first movable comb fingers 31a extends along a plane perpendicular to the X-axis direction. The plurality of first movable comb fingers 31a are arranged in such a manner that an interval between the first movable comb fingers 31a adjacent to each other in the X-axis direction becomes constant.

The second movable comb electrode 32 is thrilled by a part of the device layer 92. The second movable comb electrode 32 is disposed between the second main body portion 22a of the second support portion 22 and the second end 7b of the movable unit 7 when viewed from the X-axis direction. The second movable comb electrode 32 includes a plurality of second movable comb fingers 32a. Each of the second movable comb fingers 32a is provided on a side surface, which is opposite to the first torsion bar 11, in the second main body portion 22a of the second support portion 22. Each of the second movable comb fingers 32a extends long a plane perpendicular to the X-axis direction. The plurality of second movable comb fingers 32a are arranged in such a manner that an interval between the second movable comb fingers 32a adjacent to each other in the X-axis direction becomes constant.

The third movable comb electrode 33 is formed b a part of the device layer 92. The third movable comb electrode 33 is disposed between the third main body portion 23a of the third support portion 23 and the first end 7a of the movable unit 7 when viewed from the X-axis direction. The third movable comb electrode 33 includes a plurality of third movable comb fingers 33a. Each of the third movable comb fingers 33a is provided on a side surface, which is opposite to the second torsion bar 12, in the third main body portion 23a of the third support portion 23. Each of the third movable comb fingers 33a extends along a plane perpendicular to the X-axis direction. The plurality of third movable comb fingers 33a are arranged in such a manner that an interval between the third movable comb fingers 33a adjacent to each other in the X-axis direction becomes constant.

The fourth movable comb electrode 34 is formed by a part of the device layer 92. The fourth movable comb electrode 34 is disposed between the fourth main body portion 24a of the fourth support portion 24 and the second end 7b of the movable unit 7 when viewed front the X-axis direction. The fourth movable comb electrode 34 includes a plurality of fourth movable comb fingers 34a. Each of the fourth movable comb fingers 34a is provided on a side surface, which is opposite to the second torsion bar 12, in the fourth main body portion 24a of the fourth support portion 24. Each of the fourth movable comb fingers 34a extends along a plane perpendicular to the X-axis direction. The plurality of fourth movable comb fingers 34a are arranged in such a manner that an interval between the fourth movable comb fingers 34a adjacent to each other in the X-axis direction becomes constant.

The fifth movable comb electrode 35 is formed by a part of the device layer 92. The fifth movable comb electrode includes a plurality of fifth movable comb fingers 35a. Each of the fifth movable comb fingers 35a is provided on a side surface, which is opposite to the fifth main body portion 72, in a portion including the first end 7a in the frame 73. Each of the fifth movable comb fingers 35a extends along a plane perpendicular to the X-axis direction. The plurality of fifth movable comb fingers 35a are arranged in such a manner that an interval between the fifth movable comb fingers 35a adjacent to each other in the X-axis direction becomes constant.

The sixth movable comb electrode 36 is formed by a part of the device layer 92. The sixth movable comb electrode 36 includes a plurality of sixth movable comb fingers 36a. Each of the sixth movable comb fingers 36a is provided on a side surface, which is opposite to the fifth main body portion 72, in a portion including the second end 7b in the frame 73. Each of the sixth movable comb fingers 36a extends along a plane perpendicular to the X-axis direction. The plurality of the sixth movable comb fingers 36a are arranged in such a manner that an interval between the sixth movable comb fingers 36a adjacent to each other in the X-axis direction becomes constant.

The optical device 1 further includes a first fixed comb electrode 41, a second fixed comb electrode 42, a third fixed comb electrode 43, a fourth fixed comb electrode 44, a fifth fixed comb electrode 45, and a sixth fixed comb electrode 46. The first fixed comb electrode 41, the second fixed comb electrode 42, the third fixed comb electrode 43, the fourth fixed comb electrode 44, the fifth fixed comb electrode 45, and the sixth fixed comb electrode 46 are provided in the base 5.

The first fixed comb electrode 41 is formed by a part of the device layer 92. The first fixed comb electrode 41 includes a plurality of first fixed comb fingers 41a. Each of the first fixed comb fingers 41a is provided on a side surface of the base 5 which faces the side surface of the first main body portion 21a on which the plurality of first movable comb fingers 31a are provided. Each of the first fixed comb fingers 41a extends along a plane perpendicular to the X-axis direction. The plurality of first fixed comb fingers 41a are arranged in such a manner that an interval between the first fixed comb fingers 41a adjacent to each other in the X-axis direction becomes constant, and are disposed alternately with the plurality of first movable comb fingers 31a. The first movable comb finger 31a and the first fixed comb finger 41a adjacent to each other face each other in the X-axis direction. For example, an interval between the first movable comb finger 31a and the first fixed comb finger 41a adjacent to each other is approximately several μm.

The second fixed comb electrode 42 is formed by a part of the device layer 92. The second fixed comb electrode 42 includes a plurality of second fixed comb fingers 42a. Each of the second fixed comb fingers 42a is provided on a side surface of the base 5 which faces the side surface of the second main body portion 22a on which the plurality of second movable comb fingers 32a are provided. Each of the second fixed comb fingers 42a extends along a plane perpendicular to the X-axis direction. The plurality of second fixed comb fingers 42a are arranged in such a manner that an interval between the second fixed comb fingers 42a adjacent to each other in the X-axis direction becomes constant, and are deposed alternately with the plurality of second movable comb fingers 32a. The second movable comb finger 32a and the second fixed comb finger 42a which are adjacent face each other in the X-axis direction. For example, an interval between the second movable comb finger 32a and the second fixed comb finger 42a is approximately several μm.

The third fixed comb electrode 43 is formed by a part of the device layer 92. The third fixed comb electrode 43 includes a plurality of third fixed comb fingers 43a. Each of the third fixed comb fingers 43a is provided on a side surface of the base 5 which faces the side surface of the third main body portion 23a on which the plurality of third movable comb fingers 33a are provided. Each of the third fixed comb fingers 43a extends along a plane perpendicular to the X-axis direction. The plurality of third fixed comb fingers 43a are arranged in such a manner that an interval between the third fixed comb fingers 43a adjacent to each other in the X-axis direction becomes constant, and are disposed alternately with the plurality of third movable comb fingers 33a. The third movable comb finger 33a and the third fixed comb finger 43a adjacent to each other face each other in the X-axis direction. An interval between the third movable comb finger 33a and the third fixed comb finger 43a adjacent to each other is approximately several μm.

The fourth fixed comb electrode 44 is formed by a part of the device layer 92. The fourth fixed comb electrode 44 includes a plurality of fourth fixed comb fingers 44a. Each of the fourth fixed comb fingers 44a is provided on a side surface of the base 5 which faces the side surface of the fourth main body portion 24a on which the plurality of fourth movable comb fingers 34a are provided. Each of the fourth fixed comb fingers 44a extends along a plane perpendicular to the X-axis direction. The plurality of fourth fixed comb fingers 44a are arranged in such a manner that an interval between the fourth fixed comb fingers 44a adjacent to each other in the X-axis direction becomes constant, and are disposed alternately with the plurality of fourth movable comb fingers 34a. The fourth movable comb finger 34a and the fourth fixed comb finger 44a adjacent to each other face each other in the X-axis direction. For example, an interval between the fourth movable comb finger 34a and the fourth fixed comb finger 44a adjacent to each other is approximately several μm.

The fifth fixed comb electrode 45 is formed by a part of the device layer 92. The fifth fixed comb electrode 45 includes a plurality of fifth fixed comb fingers 45a. Each of the fifth fixed comb fingers 45a is provided on a side surface of the base 5 which faces the side surface of the frame 73 on which the plurality of fifth movable comb fingers 35a are provided. Each of the fifth fixed comb fingers 45a extends along a plane perpendicular to the X-axis direction. The plurality of fifth fixed comb fingers 45a are arranged in such a manner that an interval between the fifth fixed comb fingers 45a adjacent to each other in the X-axis direction becomes constant, and are disposed alternately with the plurality of fifth movable comb lingers 35a. The fifth movable comb finger 35a and the fifth fixed comb finger 45a adjacent to each other face each other in the X-axis direction. For example, an interval between the fifth movable comb finger 35a and the fifth fixed comb finger 45a adjacent to each other is approximately several μm.

The sixth fixed comb electrode 46 is formed by a part of the device layer 92. The sixth fixed comb electrode 46 includes a plurality of sixth fixed comb lingers 46a Each of the sixth fixed comb fingers 46a is provided on a side surface of the base 5 which faces the side surface of the frame 73 on which the plurality of sixth movable comb fingers 36a are provided. Each of the sixth fixed comb fingers 46a extends along a plane perpendicular to the X-axis direction. The plurality of sixth fixed comb fingers 46a are arranged in such a manner that an interval between the sixth fixed comb lingers 46a adjacent to each other in the X-axis direction becomes constant, and are disposed alternately with the plurality of sixth movable comb fingers 36a. The sixth movable comb finger 36a and the sixth fixed comb finger 46a which are adjacent to each other face each other in the X-axis direction. For example, an interval between the sixth movable comb finger 36a and the sixth fixed comb finger 46a adjacent to each other is approximately several μm.

A plurality of electrode pads 2, 3, and 4 are provided on the surface 92a of the device layer 92 that constitutes the base 5. A plurality of wiring portions 51, 52, and 53 are formed in the device layer 92 that constitutes the base 5 by defining parts of the device layer 92 with grooves. The electrode pads 2 are electrically connected to the first movable comb electrode 31, the second movable comb electrode 32, the third movable comb electrode 33, the fourth movable comb electrode 34, the fifth movable comb electrode 35, and the sixth movable comb electrode 36 through the wiring portions 51. The electrode pad 3 located near the fifth fixed comb electrode 45 is electrically connected to the fifth fixed comb electrode 45 through the wiring portion 52 located near the fifth fixed comb electrode 45. The electrode pad 3 located near the sixth fixed comb electrode 46 is electrically connected to the sixth fixed comb electrode 46 through the wiring portion 52 located near the sixth fixed comb electrode 46. The electrode pad 4 located near the first fixed comb electrode 41 is electrically connected to the first fixed comb electrode 41 through the wiring portion 53 located near the first fixed comb electrode 41. The electrode pad 4 located near the second fixed comb electrode 42 is electrically connected to the second fixed comb electrode 42 through the wiring portion 53 located near the second fixed comb electrode 42. The electrode pad 4 located near the third fixed comb electrode 43 is electrically connected to the third fixed comb electrode 43 through the wiring portion 53 located near the third fixed comb electrode 43. The electrode pad 4 located near the fourth fixed comb electrode 44 is electrically connected to the fourth fixed comb electrode 44 through the wiring portion 53 located near the fourth fixed comb electrode 44. Note that the plurality of electrode pads 2, 3, and 4 are not illustrated in FIG. 3 and FIG. 4.

The fifth movable comb electrode 35 and the fifth fixed comb electrode 45, and the sixth movable comb electrode 36 and the sixth fixed comb electrode 46 are used as electrodes for driving. Specifically, a voltage is periodically applied to between the fifth movable comb electrode 35 and the fifth fixed comb electrode 45, and between the sixth movable comb electrode 36 and the sixth fixed comb electrode 46 through the plurality of electrode pads 2 and 3, respectively. According to this, an electrostatic force is generated between the fifth movable comb electrode 35 and the fifth fixed comb electrode 45 and between the sixth movable comb electrode 36 and the sixth fixed comb electrode 46, and the movable unit 7 swings (that is, the optical function unit 71 swings) with the axial line L1 set as a central line in cooperation of the electrostatic force and a repulsive force generated in the first torsion bar 11 and the second torsion bar 12.

The first movable comb electrode 31 and the first fixed comb electrode 41, the second movable comb electrode 32 and the second fixed comb electrode 42, the third movable comb electrode 33 and the third fixed comb electrode 43, and the fourth movable comb electrode 34 and the fourth fixed comb electrode 44 are used as electrode for monitoring. Specifically, electrostatic capacitance between the first movable comb electrode 31 and the first fixed comb electrode 41, between the second movable comb electrode 32 and the second fixed comb electrode 42, between the third movable comb electrode 33 and the third fixed comb electrode 43, and between the fourth movable comb electrode 34 and the fourth fixed comb electrode 44 is detected through the plurality of electrode pads 2 and 4. The electrostatic capacitance varies in correspondence with a swing angle of the movable unit 7 (that is, a swing angle of the optical function unit 71). Accordingly, it is possible to feedback-control the swing angle of the movable unit 7 (that is, the swing angle of the optical function unit 71) by adjusting the drive signal (magnitude, a cycle, and the like of an application voltage) in correspondence with detected electrostatic capacitance.

In the optical device 1, a portion except for the optical function unit 71 and the plurality of electrode pads 3 and 4 is integrally formed in the SOI substrate 9 with an MEMS technology (patterning and etching). In the optical device 1, at least the portion integrally formed in the SOI substrate 9 has a shape that is line-symmetric to the axial line L1 and is line-symmetric to the axial line L2 when viewed from the z-axis direction.

As described above, in the optical device 1, the first or third movable comb electrodes 31 or 33 is located more to the first or second torsion bar 11 or 12 side than the first end 7a of the movable unit 7 when viewed from the X-axis direction, and the second or fourth movable comb electrode 32 or 34 is located more to the first or second torsion bar 11 or 12 side than the second end 7b of the movable unit 7 when viewed from the X-axis direction. According to this, even when the movable unit 7 greatly swings with the axial line L1 set as a central line, it is possible to suppress deviation of the entirety of the movable comb fingers (the first movable comb fingers 31a, the second movable comb fingers 32a, the third movable comb fingers 33a, and the fourth movable comb fingers 34a) from regions between adjacent fixed comb fingers (the first fixed comb fingers 41a, the second fixed comb fingers 42a, the third fixed comb fingers 43a, and the fourth fixed comb fingers 44a). In addition, in the optical device 1, since the first and second rib portions 21c and 22c are formed, the thickness of each of the first and second support portions 21 and 22 in the Z-axis direction becomes greater than the thickness of the first torsion bar 11 in the Z-axis direction, and since the third and fourth rib portions 23c and 24c are formed, the thickness of each of the third and fourth support portions 23 and 24 becomes greater than the thickness of the second torsion bar 12 in the Z-axis direction. According to this, when the movable unit 7 swings, it is possible to suppress the first, second, third, and fourth support portions 21, 22, 23, and 24 from being distorted. Accordingly, it is possible to cause the first, second, third, and fourth movable comb electrodes 31, 32, 33, and 34 to swing integrally with the movable unit 7, and it is possible to suppress a fluctuation of an interval between the movable comb finger and the fixed comb finger adjacent to each other. As described above, the optical device 1 with high reliability is obtained.

Note that, it is also considered that the width of each of the first, second, third, and fourth support portions 21, 22, 23, and 24 in the Y-axis direction is enlarged to suppress distortion of the first, second, third, and fourth support portions 21, 22, 23, and 24, when enlarging the width of each of the first, second, third, and fourth support portions 21, 22, 23, and 24 in the Y-axis direction, there are following disadvantages. Specifically, with regard to deformation of the first, second, third, and fourth support portions 21, 22, 23, and 24 due to swinging of the movable unit 7, there is a great effect for suppressing the deformation when enlarging the thickness of each of the first, second, third, and fourth support portions 21, 22, 23, and 24 in the Z-axis direction in comparison to the case of enlarging the width of each of the first, second, third, and fourth support portions 21, 22, 23, and 24 in the Y-axis direction. According to this, when enlarging the width of each of the first, second, third, and fourth support portions 21, 22, 23, and 24 in the Y-axis direction so as to obtain the same degree of effect in the case of enlarging the thickness of each of the first, second, third, and fourth support portions 21, 22, 23, and 24 in the Z-axis direction, the mass of each of the first, second, third, and fourth support portions 21, 22, 23, and 24 increases, and thus there is a disadvantage in swinging of the movable unit 7 at an oscillation frequency level. In addition, a distance from the first or second torsion bar 11 or 12 to the first, second, third, or fourth movable comb electrode 31, 32, 33, or 34 in the Y-axis direction increases by an increase in die width of each of the first, second, third, and fourth support portions 21, 22, 23, and 24 in the Y-axis direction. Accordingly, when suppressing deviation of the entirety of the movable comb fingers from regions between adjacent fixed comb fingers, the swing angle of the movable unit 7 is limited. As in the optical device 1, when enlarging the thickness of each of the first, second, third, and fourth support portions 21, 22, 23, and 24 in the Z-axis direction, it is possible to suppress distortion of the first, second, third, and fourth support portions 21, 22, 23, and 24 while avoiding the above-described disadvantages.

In addition, in the optical device 1, at least, the portion that is integrally formed in the SOI substrate 9 except for the plurality of electrode pads 3 and 4 has a shape that is line-symmetric to the axial line L1 and is line-symmetric to the axial line L2 when viewed from the Z-axis direction. According to this, it is possible to cause the movable unit 7 to swing with balance with the axial line L1 set as a central line.

In addition, in the optical device 1, the first torsion bar 11, the first main body portion 21a of the first support portion 21, the second main body portion 22a of the second support portion 22, the second torsion bar 12, the third main body portion 23a of the third support portion 23, and the fourth main body portion 24a of the fourth support portion 24 extend along the X-axis direction. According to this, it is possible to dispose the respective portions with efficiency while realizing simplification of a structure.

In addition, in the optical device 1, the first connection portion 21b of the first support portion 21 has a shape that is bent to be spaced apart from the first torsion bar 11, the second connection portion 22b of the second support portion 22 has a shape that is bent to be spaced apart from the first torsion bar 11, the third connection portion 23b of the third support portion 23 has a shape that is bent to be spaced apart from the second torsion bar 12, and the fourth connection portion 24b of the fourth support portion 24 has a shape that is bent to be spaced apart from the second torsion bar 12. According to this, it is possible to improve the degree of freedom in a portion where each of the first and second torsion bars 11 and 12 is connected to the movable unit 7. In addition, the first and second main body portions 21a and 22a can be closer to the first torsion bar 11 and the third and fourth main body portions 23a and 24a can be closer to the second torsion bar 12. According to this, even when the movable unit 7 greatly swings with the axial line L1 set as a central line, it is possible to suppress deviation of the entirety of the movable comb fingers from the regions between adjacent fixed comb fingers.

In addition, in the optical device 1, the first torsion bar 1 is connected to the movable unit 7 in such a manner that curvatures of an outer edge of the first torsion bar 11 and an outer edge of the movable unit 7 are continuous when viewed from the Z-axis direction, and the second torsion bar 12 is connected to the movable unit 7 in such a manner that curvatures of an outer edge of the second torsion bar 12 and an outer edge of the movable unit 7 are continuous when viewed from the Z-axis direction. According to this, stress, concentration in a portion where each of the first and second torsion bars 11 and 12 is connected to the movable unit 7 less likely to occur, and thus it is possible to suppress breakage of the first and second torsion bars 11 and 12.

In addition, in the optical device 1, when a voltage is applied to between the fifth movable comb electrode 35 and the fifth fixed comb electrode 45, and between the sixth movable comb electrode 36 and the sixth fixed comb electrode 46, the electrodes can be used as electrodes for driving. At this time, with regard to a distance from the first and second torsion bars 11 and 12 in the Y-axis direction, a distance on the fifth movable comb electrode 35 side is greater than a distance on the first movable comb electrode 31 side and a distance on the third movable comb electrode 33 side, and a distance on the sixth movable comb electrode 36 side is greater than a distance on the second movable comb electrode 32 side and the fourth movable comb electrode 34 side. According to this, even when the magnitude of an electrostatic force generated in, an electrode for driving (that is, the magnitude of a voltage applied to the electrode for driving) is not enlarged, it is possible to obtain torque necessary for causing the movable unit 7 to swing. In addition, when detecting electrostatic capacitance between the first movable comb electrode 31 and the first fixed comb electrode 41, between the second movable comb electrode 32 and the second fixed comb electrode 42, between the third movable comb electrode 33 and the third fixed comb electrode 43, and between the fourth movable comb electrode 34 and the fourth fixed comb electrode 44, the electrodes can be used as electrodes for monitoring. At this time, even when the movable unit 7 is caused to greatly swing, deviation of the entirety of the movable comb fingers from regions between adjacent fixed comb fingers is suppressed. According to this, it is possible to understand a position (a swing angle) of the movable unit 7 in the entirety of ranges in which the movable unit 7 swings.

In addition, in the optical device 1, the main body rib portion 75 provided in the fifth main body portion 72, the frame rib portion 76 extending along the frame 73, and the connection rib portion 77 connected to the main body rib portion 75 and the frame rib portion 76 in the fifth connection portions 74 are provided in the movable unit 7, and the first, second, third, and fourth rib portions 21c, 22c, 23c, and 24c which are respectively provided in the first, second, third, and fourth support portions 21, 22, 23, and 24 are connected to the frame rib potion 76. According to this, an influence of the twisting of the first and second torsion bars 11 and 12 is less likely to be transferred to the optical function unit 71, and thus it is possible to more reliably suppress distortion of the optical function unit 71. In addition, the movable unit 7, and the first, second, third, and fourth support portions 21, 22, 23, and 24 are less likely to be distorted integrally with each other, and thus, it is possible to more reliably suppress fluctuation of an interval between the movable comb finger and the fixed comb finger adjacent to each other.

In addition, in the optical device 1, the plurality of fifth connection portions 74 are respectively disposed at a position corresponding to the first end 7a (position between the first end 7a and a central position of the movable unit 7), a position corresponding to the second end 7b (position between the second end 7b and a central position of the movable unit 7), a position on an extending line of the first torsion bar 11, and a position on an extending line of the second torsion bar 12. According to this, when causing the movable unit 7 to swing at an oscillation frequency level, it is possible to prevent another mode overlapping the swinging of the movable unit 7 by enlarging a difference between the oscillation frequency of the swinging of the movable unit 7 and an oscillation frequency of the other mode.

In addition, in the optical device 1, the optical function unit 71 is a mirror. According to this, for example, it is possible to appropriately scan a predetermined region with laser light.

Hereinbefore, the first embodiment of the present disclosure has been described, but the present disclosure is not limited to the embodiment. For example, materials and shapes of the respective configurations are not limited to the above-described materials and shapes, and various materials and shapes can be employed. As an example, the width of each of the first, second, third, and fourth rib portions 21c, 22c, 23c, and 24c in the Y-axis direction may be the same as the width of each of the first, second, third, and fourth main body portions 21a, 22a, 23a, and 24a in the Y-axis direction. In addition, the first, second, third, and fourth rib portions 21c, 22c, 23c, and 24c may extend obliquely with respect to the X-axis direction or in a zigzag manner. However, even in this case, from the viewpoint of causing the movable unit 7 to swing with balance with the axial line L1 set as a central line, it is preferable that the first, second, third, and fourth rib portions 21c, 22c, 23c, and 24c are line-symmetric to the axial line L1 and are line-symmetric to the axial line L2 when viewed from the Z-axis direction.

Figure 5:
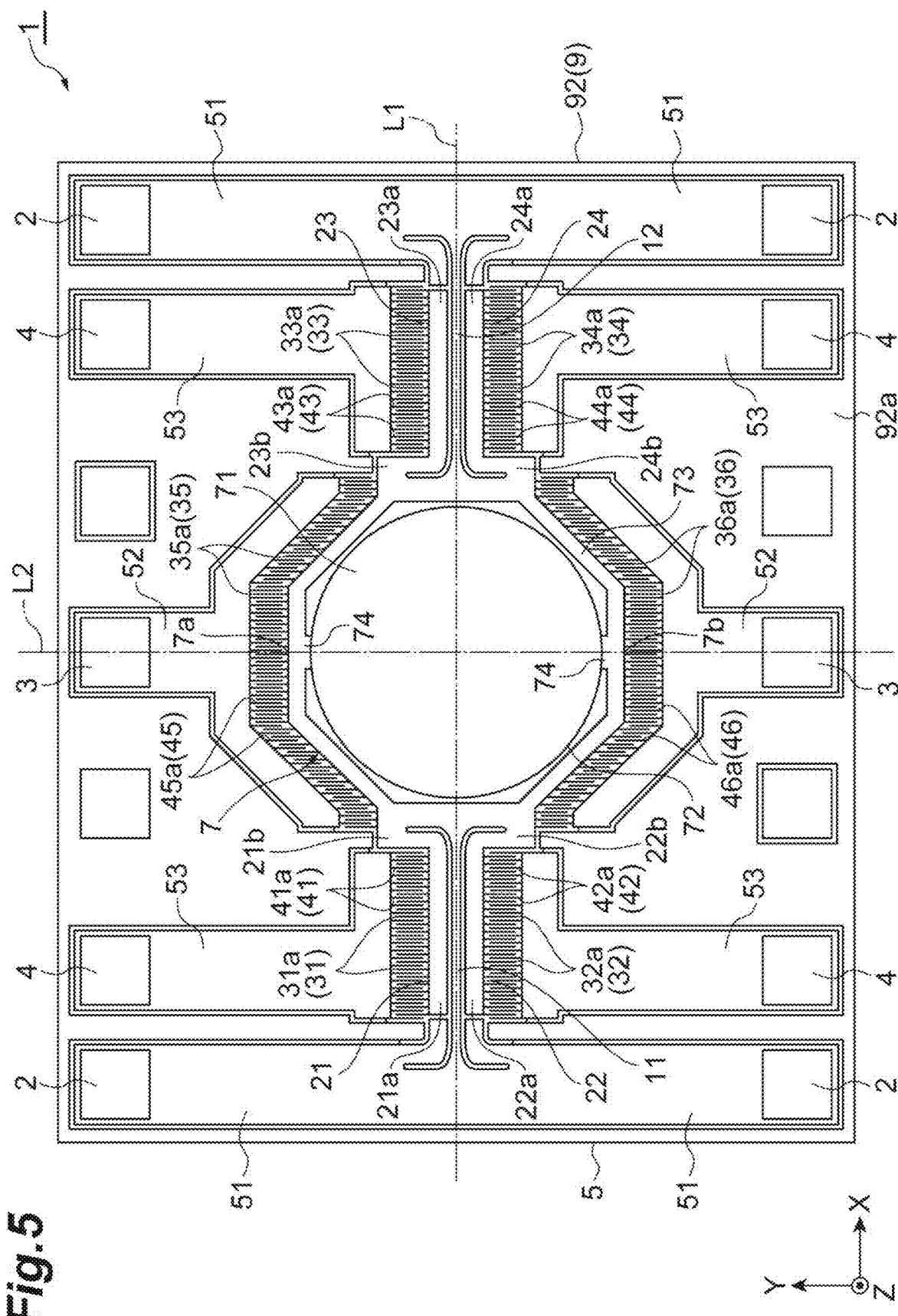
FIG. 5 is a plan view of an optical device of a modification example.

In addition, as illustrated in FIG. 5, in the movable unit 7, the plurality of fifth connection portions 74 may be respectively disposed at a position corresponding to the first end 7a (position between the first end 7a and a central position of the movable unit 7), and a position corresponding to the second end 7b (position between the second end 7b and a central position of the movable unit 7), and may not disposed at a position on an extending line of the first torsion bar 11 and a position on an extending line of the second torsion bar 12. In this case, the influence of twisting of the first and second torsion bars 11 and 12 is more less likely to be transferred to the optical function unit 71, and thus it is possible to more reliably suppress distortion of the optical function unit 71.

Figure 6:
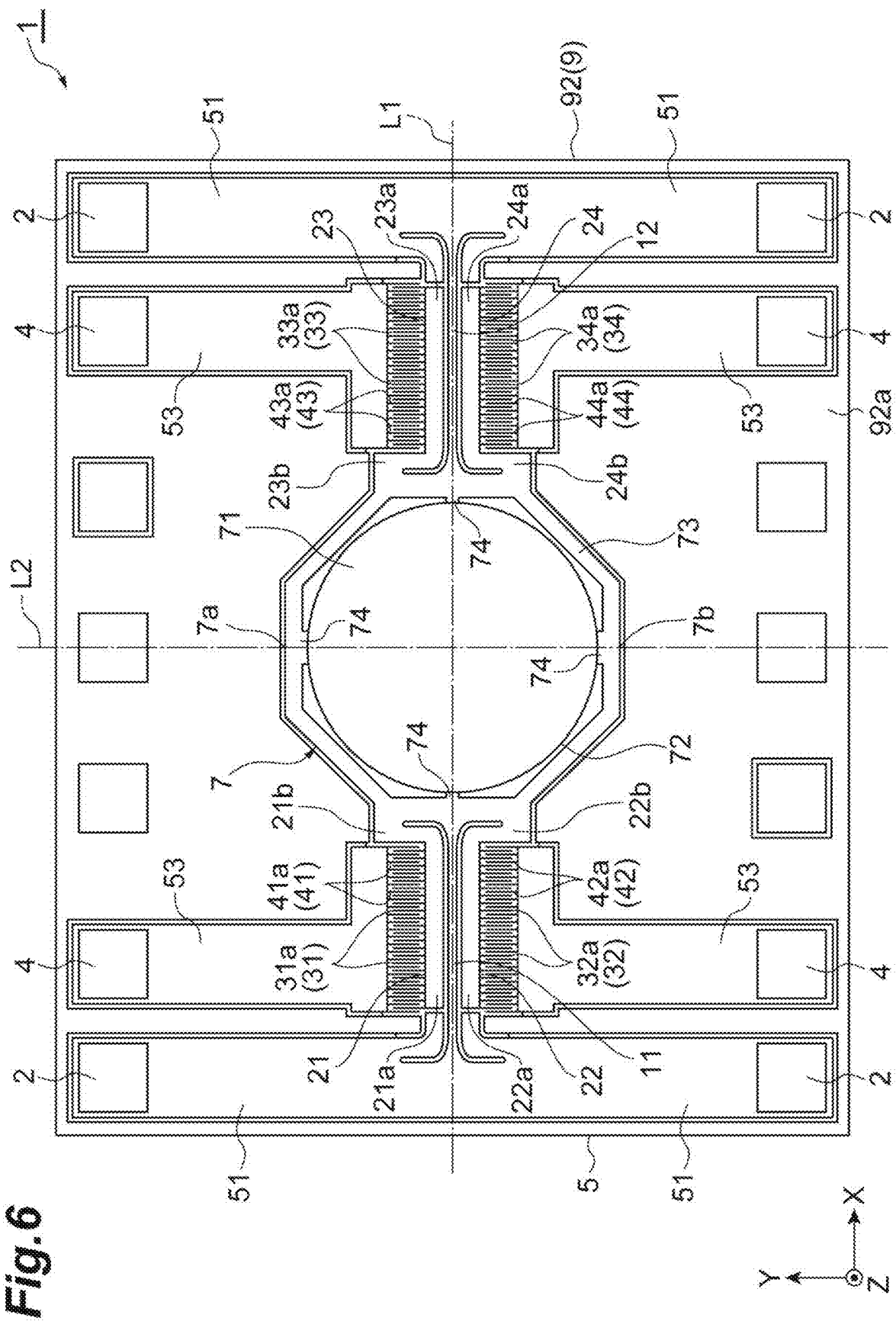
FIG. 6 is a plan view of an optical device of a modification example.

In addition, as illustrated in FIG. 6, the optical device 1 may, not include the fifth and sixth movable comb electrodes 35 and 36, and the fifth and sixth comb electrodes 45 and 46. That is, the movable comb electrodes may not be provided in the movable unit 7. In this case, when applying a voltage to between the first movable comb electrode 31 and the first fixed comb electrode 41, between the second movable comb electrode 32 and the second fixed comb electrode 42, between the third movable comb electrode 33 and the third fixed comb electrode 43, and between the fourth movable comb electrode 34 and the fourth fixed comb electrode 44, the electrodes can be used as electrode for driving. At this time, even when the movable unit 7 is caused to greatly swing, deviation of the entirety of the movable comb fingers from regions between adjacent fixed comb fingers is suppressed. According to this, it is possible to improve controllability in drive signal setting such as magnitude and a cycle of an application voltage. In addition, when detecting electrostatic capacitance between the first movable comb electrode 31 and the first fixed comb electrode 41, between the second movable comb electrode 32 and the second fixed comb electrode 42, between the third movable comb electrode 33 and the third fixed comb electrode 43, and between the fourth movable comb electrode 34 and the fourth fixed comb electrode 44, the electrodes can be used as electrodes for monitoring. At this time, even when the movable unit 7 is caused to greatly swing, deviation of the entirety of the movable comb fingers from regions between adjacent fixed comb fingers is suppressed. According to this, it is possible to understand a position (a swing angle) of the movable unit 7 in the entirety of ranges in which the movable unit 7 swings. In addition, in this case, it is possible to realize simplification of a structure of the movable unit 7. In addition, a reduction in weight of the movable unit 7, and improvement of an oscillation frequency in swinging of the movable unit 7 are realized, and it is possible to cause the movable unit 7 to swing at a higher speed.

The optical function unit 71 may be a unit other than a mirror, and for example, an optical element such as a lens ma be disposed. In addition, the main body rib portion 75 is not limited to extension along the outer edge of the fifth main body portion 72, and for example, the main body rib portion 75 may extend across the fifth main body portion 72. In addition, the movable unit 7 may not include the connection rib portion 77 that is connected to the main body rib portion 75 and the frame rib portion 76 at the fifth connection portions 74. Even in this case, it is possible to reliably suppress distortion of the optical function unit 71, and the first, second, third, and fourth support portions 21, 22, 23, and 24. In addition, when the first movable comb finger 31a and the first fixed comb finger 41a adjacent to each other face each other in the X-axis direction, the first movable, comb finger 31a and the first fixed comb finger 41a may not extend along a plane perpendicular to the X-axis direction. As an example, the first movable comb finger 31a and the first fixed comb finger 41a may extend obliquely to a plane perpendicular to the X-axis direction or may have a shape that is curved in an arc shape when viewed, from the Z-axis direction. That is, side surfaces of the first movable comb finger 31a and the first fixed comb finger 41a facing each other may face each other in the X-axis direction. This is also true of the second movable comb finger 32a and the second fixed comb finger 42a, the third movable comb finger 33a and the third fixed comb finger 43a, the fourth movable comb finger 34a and the fourth fixed comb finger 44a, the fifth movable comb finger 35a and the fifth fixed comb finger 45a, and the fifth movable comb finger 35a and the fifth fixed comb finger 45a.

REFERENCE SIGNS LIST

1: optical device, 5: base, 7: movable unit, 7a: first end, 7b: second end, 11: first torsion bar, 12: second torsion bar, 21: first support portion, 21a: first main body portion, 21b: first connection portion, 21c: first rib portion, 22: second support portion, 22a: second main body portion, 22b: second connection portion, 22c: second rib portion, 23: third support portion, 23a: third main body portion, 23b: third connection portion, 23c: third rib portion, 24: fourth support portion, 24a: fourth main body portion, 24b: fourth connection portion, 24c: fourth rib portion 31: first movable comb electrode, 31a: first movable comb finger, 32: second movable comb electrode, 32a: second movable comb finger, 33: third movable comb electrode, 33a: third movable comb finger, 34: fourth movable comb electrode, 34a: fourth movable comb finger, 35: fifth movable comb electrode, 35a: fifth movable comb finger, 36: sixth movable comb electrode, 36a: sixth movable comb finger, 41: first fixed comb electrode, 41a: first fixed comb finger 42: second fixed comb electrode, 42a: second fixed comb finger, 43: third fixed comb electrode, 43a: third fixed comb finger, 44: fourth fixed comb electrode, 44a: fourth fixed comb finger, 45: fifth fixed comb electrode, 45a: fifth fixed comb finger, 46: sixth fixed comb electrode, 46a: sixth fixed comb finger, 71: optical function unit, 72: fifth main body portion 73: frame, 74: fifth connection portion, 75: main body rib portion, 76: frame rib portion, 77: connection rib portion.

The invention claimed is:

1. An optical device comprising:
a base;
a movable unit that includes an optical function unit;
a first torsion bar that is disposed on one side of the movable unit in a first direction, and is connected to the base and the movable unit;
a second torsion bar that is disposed on the other side of the movable unit in the first direction, and is connected to the base and the movable unit;
a first support portion that is disposed on one side of the first torsion bar in a second direction perpendicular to the first direction, and is connected to the movable unit;
a second support portion that is disposed on the other side of the first torsion bar in the second direction, and is connected to the movable unit;
a third support portion that is disposed on the one side of the second torsion bar in the second direction, and is connected to the movable unit;
a fourth support portion that is disposed on the other side of the second torsion bar in the second direction, and is connected to the movable unit;
a first movable comb electrode that is provided to the first support portion, and includes a plurality of first movable comb fingers;
a second movable comb electrode that is provided to the second support portion, and includes a plurality of second movable comb fingers;
a third movable comb electrode that is provided to the third support portion, and includes a plurality of third movable comb fingers;
a fourth movable comb electrode that is provided to the fourth support portion, and includes a plurality of fourth movable comb fingers;
a first fixed comb electrode that is provided to the base, and includes a plurality of first fixed comb fingers which are disposed alternately with the plurality of first movable comb fingers;
a second fixed comb electrode that is provided to the base, and includes a plurality of second fixed comb fingers which are disposed alternately with the plurality of second movable comb fingers;
a third fixed comb electrode that is provided to the base, and includes a plurality of third fixed comb fingers which are disposed alternately with the plurality of third movable comb fingers; and
a fourth fixed comb electrode that is provided to the base, and includes a plurality of fourth fixed comb fingers which are disposed alternately with the plurality of fourth movable comb fingers, wherein each of the first movable comb fingers and each of the first fixed comb fingers which are adjacent to each other face each other in the first direction,
each of the second movable comb fingers and each of the second fixed comb fingers which are adjacent to each other face each other in the first direction,
each of the third movable comb fingers and each of the third fixed comb fingers which are adjacent to each other face each other in the first direction,
each of the fourth movable comb fingers and each of the fourth fixed comb fingers which are adjacent to each other face each other in the first direction,
the first movable comb electrode is disposed between the first support portion and a first end of the movable unit on the one side in the second direction when viewed from the first direction,
the second movable comb electrode is disposed between the second support portion and a second end of the movable unit on the other side in the second direction when viewed from the first direction,
the third movable comb electrode is disposed between the third support portion and the first end of the movable unit when viewed from the first direction,
the fourth movable comb electrode is disposed between the fourth support portion and the second end of the movable unit when viewed from the first direction,
the first support portion includes a first rib portion that is formed so that the thickness of the first support portion in a third direction perpendicular to the first direction and the second direction becomes greater than the thickness of the first torsion bar in the third direction,
the second support portion includes a second rib portion that is formed so that the thickness of the second support portion in the third direction becomes greater than the thickness of the first torsion bar in the third direction,
the third support portion includes a third rib portion that is formed so that the thickness of the third support portion in the third direction becomes greater than the thickness of the second torsion bar in the third direction,
the fourth support portion includes a fourth rib portion that is formed so that the thickness of the fourth support portion in the third direction becomes greater than the thickness of the second torsion bar in the third direction,
the first support portion further includes a first main body portion to which the first movable comb electrode is provided,
the second support portion further includes a second main body portion to which the second movable comb electrode is provided,
the third support portion further includes a third main body portion to which the third movable comb electrode is provided,
the fourth support portion further includes a fourth main body portion to which the fourth movable comb electrode is provided,
a width of the first rib portion in the second direction is smaller than a width of the first main body portion in the second direction,
a width of the second rib portion in the second direction is smaller than a width of the second main body portion in the second direction,
a width of the third rib portion in the second direction is smaller than a width of the third main body portion in the second direction, and
a width of the fourth rib portion in the second direction is smaller than a width of the fourth main body portion in the second direction.

2. The optical device according to claim 1, wherein the first torsion bar, the first main body portion, the second main body portion, the second torsion bar, the third main body portion, and the fourth main body portion extend along the first direction.

3. The optical device according to claim 2,
wherein the first support portion further includes a first connection portion that is connected to the first main body portion and the movable unit, and the first connection portion has a shape that is bent to be spaced apart from the first torsion bar,
the second support portion further includes a second connection portion that is connected to the second main body portion and the movable unit, and the second connection portion has a shape that is bent to be spaced apart from the first torsion bar,
the third support portion further includes a third connection portion that is connected to the third main body portion and the movable unit, and the third connection portion has a shape that is bent to be spaced apart from the second torsion bar, and
the fourth support portion further includes a fourth connection portion that is connected to the fourth main body portion and the movable unit, and the fourth connection portion has a shape that is bent to be spaced apart from the second torsion bar.

4. The optical device according to claim 1,
wherein the first torsion bar is connected to the movable unit in such a manner that curvatures of an outer edge of the first torsion bar and an outer edge of the movable unit are continuous when viewed from the third direction, and
the second torsion bar is connected to the movable unit in such a manner that curvatures of an outer edge of the second torsion bar and an outer edge of the movable unit are continuous when viewed from the third direction.

5. The optical device according to claim 1, further comprising:
a fifth movable comb electrode that is provided to a portion including the first end in the movable unit, and includes a plurality of fifth movable comb fingers;
a sixth movable comb electrode that is provided to a portion including the second end in the movable unit, and includes a plurality of sixth movable comb fingers;
a fifth fixed comb electrode that is provided to the base, and includes a plurality of fifth fixed comb fingers which are disposed alternately with the plurality of fifth movable comb fingers; and
a sixth fixed comb electrode that is provided to the base, and includes a plurality of sixth fixed comb fingers which are disposed alternately with the plurality of sixth movable comb fingers,
wherein each of the fifth movable comb fingers and each of the fifth fixed comb fingers which are adjacent to each other face each other in the first direction, and
each of the sixth movable comb fingers and each of the sixth fixed comb fingers which are adjacent to each other face each other in the first direction.

6. The optical device according to claim 1,
wherein the movable comb electrodes are not provided to the movable unit.

7. The optical device according to claim 1,
wherein the movable unit further includes a fifth main body portion to which the optical function unit is provided, a frame that surrounds the fifth main body portion when viewed from the third direction, a plurality of fifth connection portions that are connected to the fifth main body portion and the frame, a main body rib portion that is provided to the fifth main body portion, and a frame rib portion that extends along the frame, and the first rib portion, the second rib portion, the third rib portion, and the fourth rib portion are connected to the frame rib portion.

8. The optical device according to claim 7,
wherein the movable unit further includes a connection rib portion that is connected to the main body rib portion and the frame rib portion in each of the plurality of fifth connection portions.

9. The optical device according to claim 7,
wherein the plurality of fifth connection portions are disposed at positions corresponding to the first end and the second end of the movable unit.

10. The optical device according to claim 1,
wherein the optical function unit is a mirror.

* * * * *